(12) United States Patent
Qian et al.

(10) Patent No.: US 7,639,005 B2
(45) Date of Patent: Dec. 29, 2009

(54) GIANT MAGNETORESISTIVE RESISTOR AND SENSOR APPARATUS AND METHOD

(75) Inventors: Zhenghong Qian, Westborough, MA (US); Gunther Baubock, Southborough, MA (US); Barry T. O'Connell, Worcester, MA (US)

(73) Assignee: Advanced Microsensors, Inc., Shrewsbury, MA (US)

( * ) Notice: Subject to any disclaimer, the term of this patent is extended or adjusted under 35 U.S.C. 154(b) by 299 days.

(21) Appl. No.: 11/763,560

(22) Filed: Jun. 15, 2007

(65) Prior Publication Data
US 2008/0309331 A1 Dec. 18, 2008

(51) Int. Cl.
*G01R 33/09* (2006.01)
*G01R 33/02* (2006.01)

(52) U.S. Cl. .................. 324/252; 324/207.21

(58) Field of Classification Search .............. 324/207.2, 324/207.21, 207.24, 251–252; 123/612, 123/617; 338/32 R, 32 H; 360/313–316, 360/324–327; 365/8, 158, 171, 173
See application file for complete search history.

(56) References Cited

U.S. PATENT DOCUMENTS

| | | | |
|---|---|---|---|
| 5,569,544 A | 10/1996 | Daughton | |
| 5,617,071 A | 4/1997 | Daughton | |
| 6,313,973 B1 | 11/2001 | Fuke et al. | |
| 6,392,853 B1 | 5/2002 | Li et al. | |
| 6,577,124 B2 | 6/2003 | Coehoorn et al. | |
| 6,770,382 B1 | 8/2004 | Chang et al. | |
| 6,859,063 B2 | 2/2005 | Nuspl et al. | |
| 6,961,225 B2 | 11/2005 | Gill | |
| 6,992,919 B2 | 1/2006 | Andrei et al. | |
| 2008/0154342 A1* | 6/2008 | Digby et al. | ...... 607/63 |

OTHER PUBLICATIONS

IBM, MR Read Head Design, NN871081, Oct. 1987.*
Baibich, M. N., et al., Giant Magnetoresistance of (001) Fe/(001)Cr Magnetic Superlattices, Phys. Rev. Lett., vol. 61, No. 21 (1988) pp. 2472-2475.

* cited by examiner

*Primary Examiner*—Bot L LeDynh
(74) *Attorney, Agent, or Firm*—Foley Hoag LLP

(57) ABSTRACT

A giant magnetoresistive sensor apparatus is described that provides improved multilayer quality, hysteresis, linearity and sensitivity. The multilayer structure includes NiFeCr as buffer and cap layers. The sensing resistor is designed in the form of a serpentine structure. To minimize the hysteresis and improve the linearity, the resistor end is tapered and elongated. In forming the sensor in a Wheatstone bridge configuration, two resistors are shielded by thick NiFe layers, while the two sensing resistors are not shielded and open to external signal fields. The shields can not only shield the influence of the external field on the shielded resistors but also serve as magnetic flux concentrators to magnify the external field on the unshielded resistors. The bridge output reflects the resistance change of the two unshielded sensing resistors.

21 Claims, 5 Drawing Sheets

GIANT MAGNETORESISTIVE RESISTOR AND SENSOR APPARATUS AND METHOD

FIELD

The apparatus and methods relate to Giant Magnetoresistive (GMR) sensors and more particularly to a GMR multilayer structure patterned into resistors for use in a Wheatstone bridge type sensor.

BACKGROUND

The Giant Magneto-Resistance (GMR) effect was discovered in ultra thin magnetic multilayer films in 1988. The GMR multilayer structure is composed of alternating ferromagnetic and nonmagnetic metal layers. The origin of the GMR effect is due to the spin-dependent scattering in thin magnetic multilayers with thickness of a few nanometers. At the zero-field state, magnetizations of adjacent ferromagnetic layers are antiparallel due to Ruderman, Kittel, Kasuya, and Yoshida (RKKY) coupling between layers. However, when an external magnetic field is applied, all magnetizations will rotate toward the field direction, resulting in a decrease of magnetoresistance due to less spin scattering.

The lowest magnetoresistance occurs at the state when the magnetizations of adjacent ferromagnetic layers are aligned parallel by the applied magnetic field. GMR sensing elements based on GMR multilayers have many advantages over other magnetic sensing elements with regard to size, simplicity, power consumption, sensitivity, frequency characteristics and thermal stability. As a result, the GMR sensing element has been applied in various sensors. For example, GMR sensing elements have been used in magnetic heads, position sensors, magnetic encoders, gear tooth sensors and other applications.

The most difficult technical challenges in GMR sensor applications remain: 1) fabricating the GMR multilayers with desired quality; and 2) fabricating GMR sensors with low hysteresis, excellent linearity and desired sensitivity.

SUMMARY

The GMR apparatus described herein are fabricated to provide improved sensor quality, hysteresis, linearity and sensitivity. The multilayer includes NiFeCr as buffer and cap layers. The sensing resistor is designed in the form of a serpentine structure. To minimize the hysteresis and improve the linearity, the resistor end is tapered and elongated. In forming the sensor in a Wheatstone bridge configuration, two resistors are shielded by thick NiFe layers, while the two sensing resistors are not shielded and open to external signal fields. The shields can not only shield the influence of the external field on the shielded resistors but also serve as magnetic flux concentrators to magnify the external field on the unshielded resistors. The bridge output reflects the resistance change of the two unshielded sensing resistors.

In one embodiment, a magnetoresistive multilayer resistor includes an array of long, narrow and thin line elements. For ease of reference, the line elements are described herein as lines or wires, without limitation as to their cross-sectional shape. The multilayer resistor may also include first connecting elements, each first connecting element positioned to connect first ends of two adjacent wires, second connecting elements, each second connecting element positioned to connect opposite ends of the two adjacent wires to a respective oppositely adjacent wire. A length of each of the first and second connecting elements in a direction along a length of the wires is greater than a width of a wire and an end of each of the first and second connecting elements distant from the wires is tapered along the length of the connecting element.

In some aspects, the taper has a length in a range of about three to five times a width of one of the line elements connected thereto. The taper may vary linearly along its length. A portion of the first and second connecting elements between adjacent sides of the two adjacent line elements may include a further taper along the length of the connecting element whose shape may conform to that of the other taper.

In one embodiment, a magnetoresistive multilayer sensor includes four resistor elements connected to form a Wheatstone bridge and shielding elements positioned over two diagonally opposite ones of the resistor elements to shield the diagonally opposite resistor elements from external fields. The shielding elements extend partially over interconnecting ends of the remaining two resistor elements.

In one aspect, the resistor elements comprise an array of line elements, a first subset of the interconnecting ends positioned to connect first ends of two adjacent line elements and a second subset of interconnecting ends positioned to connect opposite ends of the two adjacent line elements to a respective oppositely adjacent line element. A length of each interconnecting end in a direction along a length of the line elements is greater than a width of a line element and a portion of each interconnecting end distant from the line elements includes a taper along the length of the interconnecting end.

In some aspects, the taper has a length in a range of about three to five times a width of one of the line elements connected thereto. The taper may vary linearly along its length. The shielding elements may be fabricated from a material selected from a group of materials including NiFe, NiFeB and CdZnTe. The shielding elements may have a thickness in a range of about 1 µm to 20 µm.

In one embodiment, a method of forming layers a magnetoresistive multilayer resistor includes forming an array of magnetoresistive multilayer line elements, connecting opposite ends of each line element to opposite ones of adjacent line elements to form a serpentine pattern of line elements and connections between the line elements, elongating the connections between the line elements in a direction along a length of the line elements a distance greater than a width of the line elements and tapering the connections along the length of the connections. In one aspect, the method may include tapering a connection over a length in a range of about three to five times a width of one of the line elements connected thereto by varying a width of a connection linearly along its length.

In one embodiment, a method of forming a magnetoresistive multilayer Wheatstone bridge element includes connecting four magnetoresistive multilayer resistors in the Wheatstone bridge configuration, shielding diagonally positioned opposite ones of the resistor elements from external fields and partially shielding interconnecting ends of the remaining two resistor elements.

In one aspect, the method includes forming the magnetoresistive multilayer resistors by forming an array of magnetoresistive multilayer line elements, connecting opposite ends of each line element to opposite ones of adjacent line elements to form a serpentine pattern of line elements and connections between the line elements, elongating the connections between the line elements in a direction along a length of the line elements a distance greater than a width of the line elements and tapering the connections along the length of the connections. In one aspect, the method may include tapering a connection over a length in a range of about three to five times a width of one of the line elements connected thereto by varying a width of a connection linearly along its length.

BRIEF DESCRIPTION OF THE DRAWINGS

The following figures depict certain illustrative embodiments in which like reference numerals refer to like elements. These depicted embodiments are to be understood as illustrative and not as limiting in any way.

DETAILED DESCRIPTION OF CERTAIN ILLUSTRATED EMBODIMENTS

To provide an overall understanding, certain illustrative embodiments will now be described; however, it will be understood by one of ordinary skill in the art that the systems and methods described herein can be adapted and modified to provide systems and methods for other suitable applications and that other additions and modifications can be made without departing from the scope of the systems and methods described herein.

Unless otherwise specified, the illustrated embodiments can be understood as providing exemplary features of varying detail of certain embodiments, and therefore, unless otherwise specified, features, components, modules, and/or aspects of the illustrations can be otherwise combined, separated, interchanged, and/or rearranged without departing from the disclosed systems or methods. Additionally, the shapes and sizes of components are also exemplary and unless otherwise specified, can be altered without affecting the disclosed systems or methods.

Figure 1:
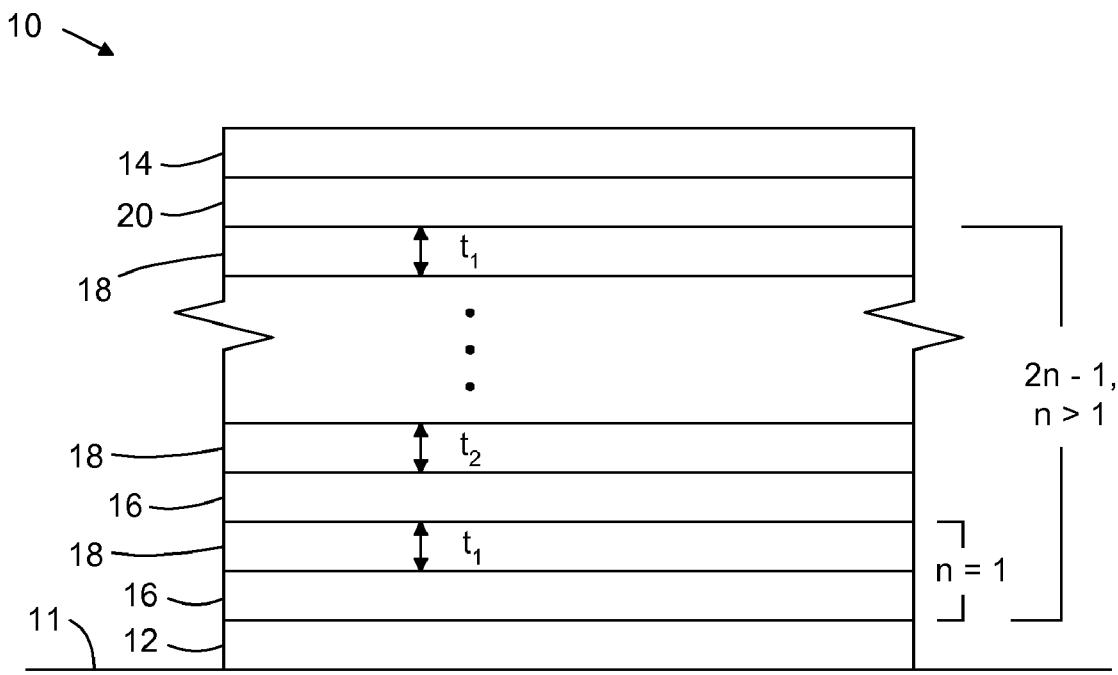
FIG. 1 is a schematic cross-sectional view of an embodiment of a GMR multilayer structure.

Referring now to FIG. 1, there is illustrated a cross-sectional view of a GMR multilayer structure 10 for use in fabricating the GMR apparatus described herein. As is known in the art, multilayer structure 10 may be composed of a series of alternating ferromagnetic and nonmagnetic metal layers or films. As is known in the art, multilayer structure 10 may be deposited on a substrate 11. In general, substrate 11 may be any nonmagnetic substrate material that provides mechanical stability and a smooth surface for deposition of the structure 10. If a non-insulating material, such as Si, is used for substrate 11, an electrically insulating layer, such as $SiO_2$, $Si_3N_4$, or $Al_2O_3$, needs to be deposited before deposition of structure 10. For the embodiment illustrated in FIG. 1, structure 10 includes a lower buffer layer 12 for promoting the growth of subsequent layers with better crystal structure. A cap layer 14 forms the topmost layer of structure 10. In the preferred embodiment of FIG. 1, buffer layer 12 and cap layer 14 may be fabricated of NiFeCr or alloys thereof, though other buffer materials known in the art, such as tantalum, may be used and the buffer layer 12 and cap layer 14 need not be of the same material. Preferred properties for buffer layer 12 and cap layer 14 materials include nonmagnetic, highly electrically resistive and chemically inert. Thicknesses of the buffer layer 12 and the cap layer 14 may range from about 10 Å to 100 Å, so as to provide chemical protection, but not shunt a significant fraction of the sense current through layers.

Between buffer layer 12 and cap layer 14, a series of n alternating ferromagnetic layers 16 and nonmagnetic layers 18 form the core of structure 10, beginning with ferromagnetic layer 16 adjacent buffer layer 12. As illustrated in FIG. 1, n refers to the number of pairs of layers 16, 18. The number n of alternating layers 16, 18 may depend on the requirements for the GMR value, the desired resistance of the sensor and the saturation field. Generally, as n increases, the GMR effect increases, the sensor resistance decreases and the saturation field increases. Typical thicknesses for the ferromagnetic layers 16 may range from about 10 Å to 50 Å. A final ferromagnetic layer 20 lies between the uppermost nonmagnetic layer 18 and the cap layer 14.

The thicknesses of the nonmagnetic layers 18 may also be alternated between a first thickness, $t_1$, corresponding to a $1^{st}$ or $2^{nd}$ RKKY antiferromagnetically-coupled peak, and a second thickness, $t_2$, which depends on the requirements for the saturation field. As known in the art, the first thickness $t_1$ is approximately 9 Å for the first RKKY antiferromagnetically coupled peak and approximately 18 Å for the second RKKY antiferromagnetically coupled peak. Those of skill in the art may appreciate that the thicknesses $t_1$ and $t_2$ may be the same for some applications. In the preferred embodiment illustrated in FIG. 1, the number of layers n may be an odd number of three or more layers, such that a nonmagnetic layer 18 of first thickness $t_1$ is adjacent final ferromagnetic layer 20. In some embodiments, ferromagnetic layers 16, 20 may include an interface dusting layer adjacent the nonmagnetic layers 18. As known, the use of interface dusting layers may increase the GMR effect by enhancing spin scattering at the interface of the nonmagnetic and the ferromagnetic layers. Commonly used materials for the interface dusting are Co, CoFe and CoNiFe.

Figure 2:
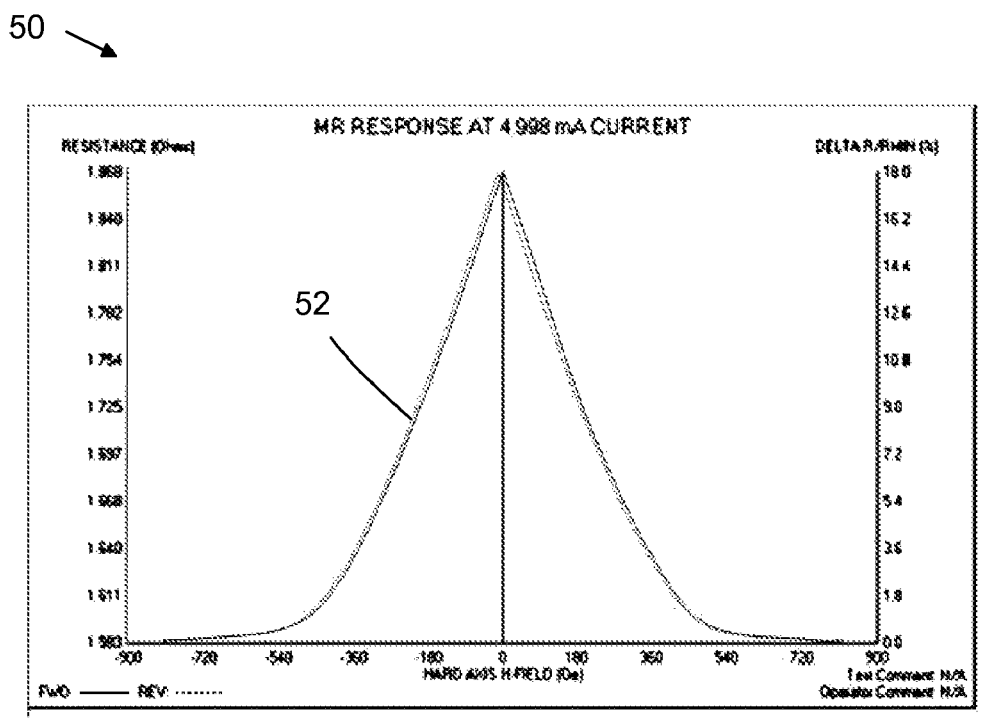
FIG. 2 is a plot of a transfer curve for a GMR multilayer structure fabricated according to FIG. 1.

FIG. 2 is a plot 50 of a transfer curve 52 for a GMR multilayer structure fabricated in the manner described for structure 10 of FIG. 1. For FIG. 2, the GMR effect is approximately 18% and the saturation field, Hsat, is approximately 390 Oe. As shown in FIG. 2, the transfer curve 52 has a triangular shape and low hysteresis. The properties of the GMR multilayer structure thus illustrated by plot 50 are known in the art to be desirable properties for sensing device applications.

Figure 3A:
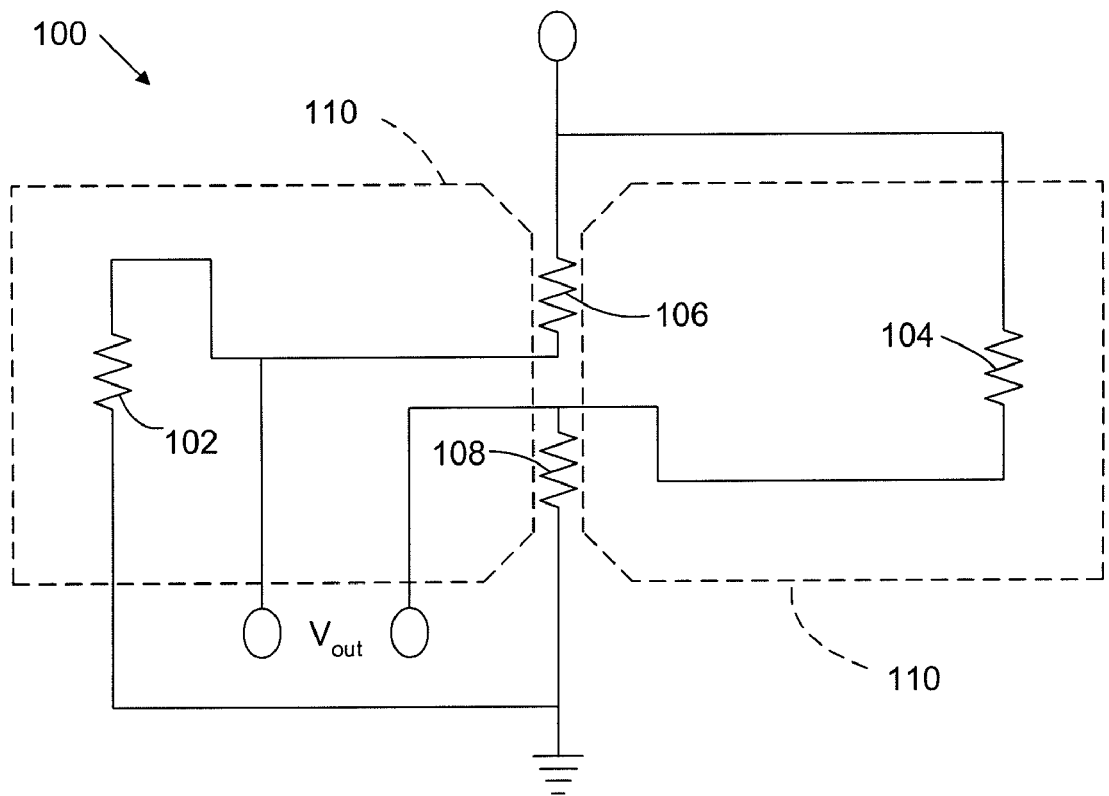
FIG. 3a is a schematic diagram of an embodiment of a GMR sensor.

Referring now to FIG. 3a, there is shown a schematic diagram of a GMR multilayer structure, such as structure 10 of FIG. 1, constructed into a GMR magnetic sensor 100. For the embodiment illustrated in FIG. 3a, sensor 100 is configured as a Wheatstone bridge, with resistors 102, 104, 106 and 108 fabricated from the GMR multilayers. Resistors 102 and 104 are shielded by shielding 110, while sensing resistors 106 and 108 are not shielded and are open to external signal fields. In addition to shielding resistors 102 and 104 from external fields, shielding 110 may serve to concentrate magnetic flux so as to magnify the external field on resistors 106 and 108. Shielding 110 may be formed of a layer of NiFe, with a thickness in the range of about 1 μm to 20 μm. Any ferromagnetic material with typical "soft" magnetic properties can be used as a shield and/or magnetic flux concentrator. Desirable properties are high permeability, high magnetic moment, low hysteresis and low coercivity. Examples for these materials are NiFe, NiFeB and CZT (CdZnTe). The dimensions (length, width and thickness) of shields and flux concentrators may be chosen such that a desired magnification factor of the magnetic field acting on the unshielded sensors is achieved. As is known, the magnification factor, together with other factors, determines the effective field range of the sensor.

Figure 3B:
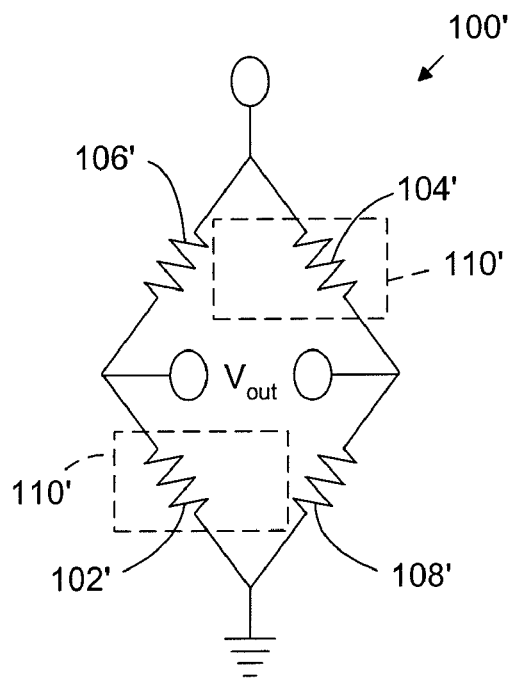
FIG. 3b is a schematic diagram of the embodiment of FIG. 3a shown in a traditional Wheatstone bridge schematic layout.

For ease of visualization, FIG. 3b represents sensor 100', with resistors 102', 104', 106' and 108' and shielding 110' in the more traditional Wheatstone bridge schematic layout. Upon inspection of FIGS. 3a and 3b, those of skill in the art will recognize the equivalency of sensors 100 and 100'.

Figure 4:
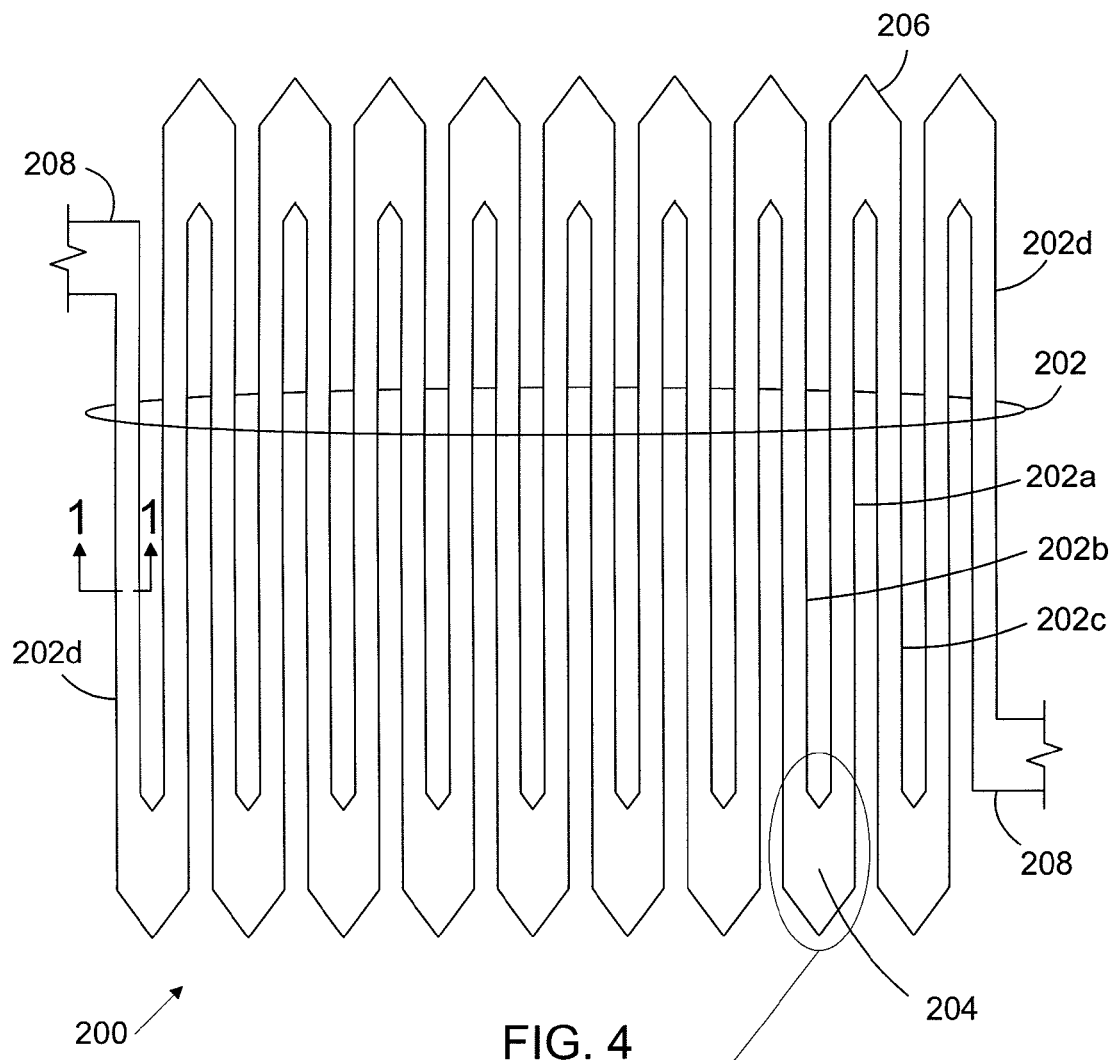
FIG. 4 is a schematic plan view of an embodiment of a GMR multilayer resistor.

Referring to FIG. 4, there is shown a schematic plan view of a GMR multilayer resistor 200 that may be used for resistors 102-108 in FIG. 3a, or in other applications as described in relation to FIG. 3a. The multilayer structure of resistor 200 is illustrated in FIG. 1, as indicated by cross-section 1-1. Preferably, resistor 200 is fabricated in the form of a serpentine structure. For ease of reference, but not limitation, directions and locations used in describing the resistor 200 refer to the orientation of resistor 200 in FIG. 4.

The serpentine shape is formed by an array of GMR multilayer, long, narrow and thin elements 202. For ease of reference, elements 202 are described herein as lines or wires 202, without limitation as to their cross-sectional shape. Each line or wire 202 is connected at its upper and lower ends to opposite ones of its adjacent lines or wires. For example, wire 202a has a lower connection 204 connecting to wire 202b, and an upper connection 206 connecting to wire 202c. In the case of the outermost wires 202d, the ends 208 of resistor 200 connect to the circuitry (not shown) of which resistor 200 forms a part. As is known in art, the number, length, width and spacing of wires 202 may be varied to suit the desired resistances, circuit sizing and/or fabrication techniques for the circuit or sensor.

For the Wheatstone bridge configuration of FIGS. 3a and 3b, the resistors are positioned in the gap between the two shields/concentrators. The narrower the gap area and the larger the shield area, the higher the field concentration effect. The field at the sensor element location in the gap area is proportional to the ratio of the shield area over the gap area. Referring to the gap area as $S_{gap}$, the shield area as $S_{shield}$ and the external field as $H_{external}$, then the concentrated field in the gap can be estimated by the formula, $H=C*(S_{shield}/S_{gap})*H_{external}$. Here, the constant C is an experimentally determined factor. The final dimensions will be determined by the desired device sensitivity and operation range. For ease in fabrication, though not for limitation, wires 202 generally may be parallel and equally sized and spaced, as in the illustrated embodiment of FIG. 4.

Figure 5:
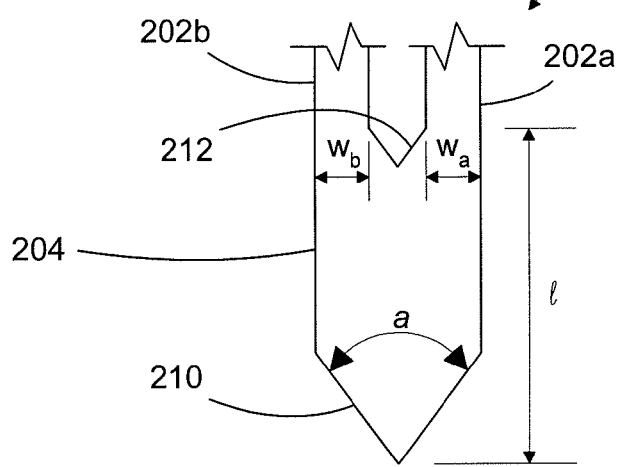
FIG. 5 is a detailed view of a portion of the embodiment of FIG. 4.

Referring now to FIG. 5, there is shown a detailed view of a lower connection 204, which connects wires 202a and 202b. It may be understood that upper connections 206 may be configured in a similar manner. Wires 202a and 202b may have equal or respective widths $w_a$ and $w_b$. Connection 204 is elongated, such that its overall length, l, is much greater than either of widths $w_a$ or $w_b$. Additionally, length l includes exterior taper 210 and interior taper 212 to gradually transition between wires 202a and 202b. While some benefits may be realized by using a single taper, providing both exterior taper 210 and interior taper 212 achieves the best effect. For illustration, taper 210 is shown tapering linearly, though curved tapers may be used in lieu of, or in combination with, linear tapers. An elongated, tapered connection, as illustrated by connection 204 in FIG. 5, has been found to lessen hysteresis and improve linearity. For linear taper 210, interior angle a may be about 120° or less. Curved tapers may be shaped generally commensurate with linear taper 210. Taper 212 generally may conform to the shape described for taper 210. For exemplary line widths of 2 μm or less, a length l in the range of about 6 μm to 10 μm is preferred. For line or wire widths exceeding 2 μm, a length l of about 10 μm is preferred.

Figure 6:
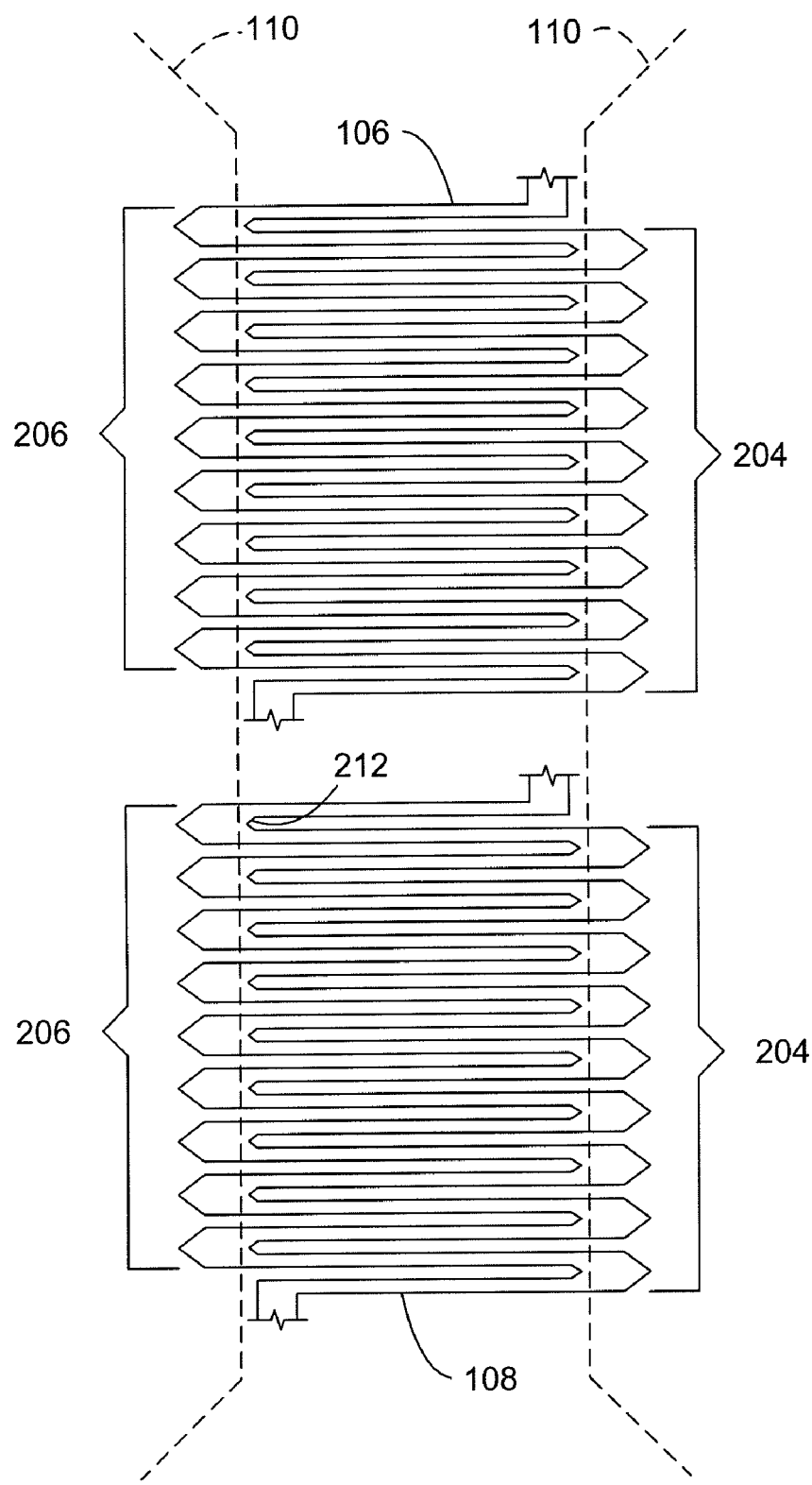
FIG. 6 is a schematic plan view of a portion of the embodiment of FIG. 3a incorporating the embodiment of FIG. 4.

Referring to FIG. 6, there is shown a schematic plan view of a portion of sensor 100 of FIG. 3a, including resistors 106 and 108. As shown therein, shielding 110 overlaps the greater portion of connections 204 and 206, but does not extend to interior tapers 212 (only one of which is designated in FIG. 6 for clarity). In addition to the elongation and tapering of connections 204 and 206, overlapping of shielding 110 onto connections 204 and 206 further lessens hysteresis and improves linearity. As known in the art, the resistor ends are the major source of hysteresis in such devices. By overlapping the resistor ends with shielding 110, the resistor ends become less active and thus contribute less to the device hysteresis. An overlap between the resistor end and the shield in a range of about three to five times the line width of the resistor has been found to produce satisfactory results.

Figure 7:
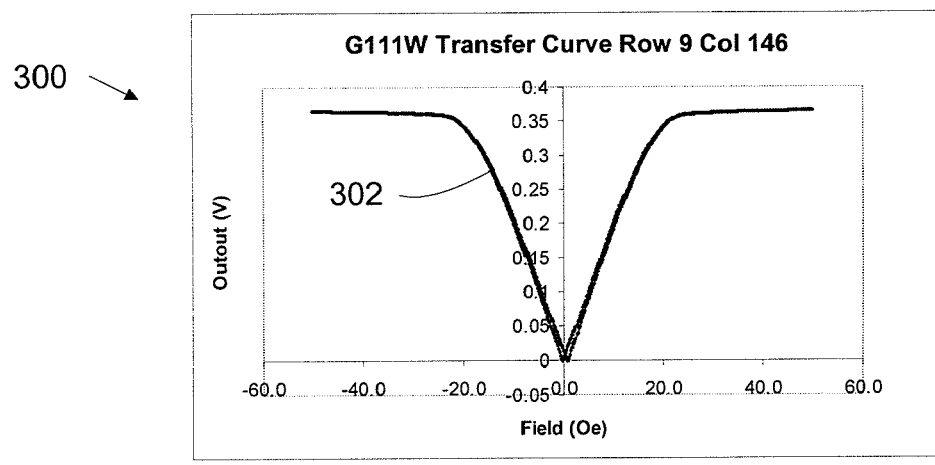
FIG. 7 is a plot of a transfer curve of a fabricated GMR bridge sensor.
Figure 8:
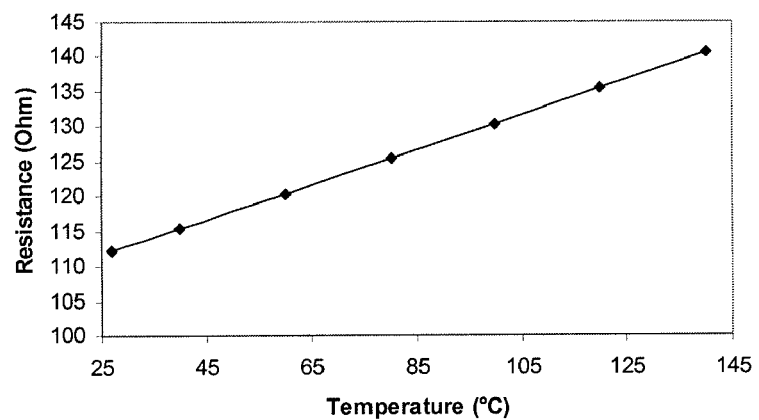
FIG. 8 is a plot of resistance versus temperature for a GMR resistor.
Figure 9:
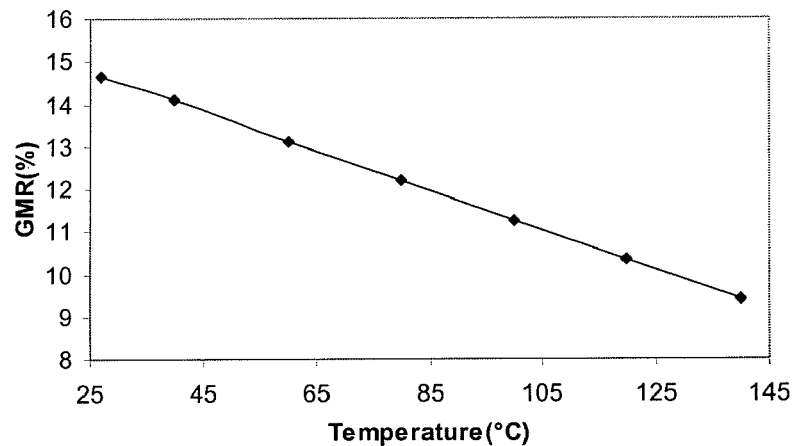
FIG. 9 is a plot of the correlation of the GMR ratio with temperature for a fabricated GMR sensor.

GMR components fabricated in accordance with the embodiments described with relation to FIGS. 1-6, and particularly GMR resistors and bridge sensors, have improved performance when compared to other resistors and/or sensors not so fabricated. FIGS. 7-9 provide plots of performance characteristics for an exemplary GMR bridge sensor fabricated in accordance with the embodiments described with relation to FIGS. 1-6.

FIG. 7 shows a plot 300 of transfer curve 302 of a fabricated GMR bridge sensor with a bridge resistance of about 5KΩ. Those of skill in the art will recognize the improved performance of the sensor as shown by plot 300, wherein a sensitivity of about 3.8 mV/V/Oe and an operation range of about 18 Oe are shown.

FIG. 8 shows a plot 400 of resistance versus temperature for a GMR resistor, which demonstrates the good thermal stability of a fabricated GMR sensor. From plot 400, the resistance at room temperature is shown to be 112.3 Ω and to increase linearly with increasing temperature, reaching 140.5Ω at 140° C.

FIG. 9 shows a plot 500 of the correlation of the GMR ratio with temperature for a fabricated GMR sensor. As shown on plot 500, GMR decreases to 9.4% at 140° C. from an initial GMR of 14.62% at room temperature, providing a GMR temperature coefficient (TCG) of about −0.046% per ° C.

What are thus described are GMR multilayer structures and methods of fabrication that may be formed into GMR resistors for use in sensors that provide low hysteresis, excellent linearity and controllable saturation fields.

While the apparatus and methods have been disclosed in connection with the illustrated embodiments, various modifications and improvements thereon will become readily apparent to those skilled in the art. For example, the multilayer structure of FIG. 1 may be used to form other GMR components in addition to the resistors and bridge sensors described. Additionally, the resistors described herein may be incorporated into other circuits in addition to the Wheatstone bridge illustrated herein. Accordingly, it will be understood that the following claims are not to be limited to the embodiments disclosed herein, but can include practices otherwise than specifically described, and are to be interpreted as broadly as allowed under the law.

What is claimed is:

1. A magnetoresistive multilayer resistor, comprising:
   an array of line elements;
   first connecting elements, each first connecting element positioned to connect first ends of two adjacent line elements;
   second connecting elements, each second connecting element positioned to connect opposite ends of the two adjacent line elements to a respective oppositely adjacent line element, wherein
   a length of each of the first and second connecting elements in a direction along a length of the line elements is greater than a width of a line element, and
   an end of each of the first and second connecting elements distant from the line elements includes a first taper along the length of the connecting element.

2. The resistor of claim 1, wherein the first taper has a length in a range of about three to five times a width of one of the line elements connected thereto.

3. The resistor of claim 2, wherein the first taper varies linearly along its length.

4. The resistor of claim 2, wherein a portion of the first and second connecting elements between adjacent sides of the two adjacent line elements includes a second taper along the length of the connecting element.

5. The resistor of claim 4, wherein a shape of the second taper conforms to a shape of the first taper.

6. The resistor of claim 1, wherein a portion of the first and second connecting elements between adjacent sides of the two adjacent line elements includes a second taper along the length of the connecting element.

7. The resistor of claim 6, wherein a shape of the second taper conforms to a shape of the first taper.

8. The resistor of claim 7, wherein the first taper varies linearly along its length.

9. A magnetoresistive multilayer sensor, comprising:
   four resistor elements connected to form a Wheatstone bridge;
   shielding elements positioned over two diagonally opposite ones of the resistor elements to shield the diagonally opposite resistor elements from external fields, wherein the shielding elements extend partially over interconnecting ends of the remaining two resistor elements, wherein the resistor elements each comprise:
   an array of line elements;
   a first subset of the interconnecting ends, each interconnecting end of the first subset positioned to connect first ends of two adjacent line elements;
   a second subset of interconnecting ends, each interconnecting end of the second subset positioned to connect opposite ends of the two adjacent line elements to a respective oppositely adjacent line element, wherein
   a length of each interconnecting end in a direction along a length of the line elements is greater than a width of a line element, and
   a portion of each interconnecting end distant from the line elements includes a taper along the length of the interconnecting end.

10. The sensor of claim 9, wherein the taper has a length in a range of about three to five times a width of one of the line elements connected thereto.

11. The sensor of claim 10, wherein the taper varies linearly along its length.

12. The sensor of claim 11, wherein the shielding elements are fabricated from a material selected from a group of materials including NiFe, NiFeB and CdZnTe.

13. The sensor of claim 12, wherein the shielding elements have a thickness in a range of about 1 μm to 20 μm.

14. A method of forming a magnetoresistive multilayer resistor, comprising:
    forming an array of magnetoresistive multilayer line elements;
    connecting opposite ends of each line element to opposite ones of adjacent line elements to form a serpentine pattern of line elements and connections between the line elements, wherein the line elements are connected in series;
    elongating the connections between the line elements, in a direction along a length of the line elements, a distance greater than a width of the line elements; and
    tapering the connections along the length of the connections.

15. The method of claim 14, wherein tapering the connections comprises tapering a connection over a length in a range of about three to five times a width of one of the line elements connected thereto.

16. The resistor of claim 15, wherein tapering comprises varying a width of a connection linearly along its length.

17. The resistor of claim 14, wherein tapering comprises varying a width of a connection linearly along its length.

18. A method of forming a magnetoresistive multilayer Wheatstone bridge sensor element, comprising:
    connecting four magnetoresestive multilayer resistor elements in the Wheatstone bridge configuration;
    shielding diagonally positioned opposite ones of the resistor elements to shield the diagonally positioned opposite resistor elements from external fields;
    partially shielding interconnecting ends of the remaining two resistor elements, wherein connecting comprises:
    forming an array of magnetoresistive multilayer line elements;
    connecting opposite ends of each line element to opposite ones of adjacent line elements to form a serpentine pattern of line elements and connections between the line elements;
    elongating the connections between the line elements, in a direction along a length of the line elements, a distance greater than a width of the line elements; and
    tapering the connections along the length of the connections, wherein
    the forming, connecting opposite ends, elongating and tapering serve to form one of the magnetoresistive multilayer resistor elements.

19. The method of claim 18, wherein tapering the connections comprises tapering connections over a length in a range of about three to five times a width of one of the line elements connected thereto.

20. The method of claim 19, wherein tapering comprises varying a width of a connection linearly along its length.

21. The method of claim 18, wherein tapering comprises varying a width of a connection linearly along its length.

* * * * *